(12) United States Patent
Taylor et al.

(10) Patent No.: US 9,987,699 B2
(45) Date of Patent: *Jun. 5, 2018

(54) ELECTROCHEMICAL SYSTEM AND METHOD FOR ELECTROPOLISHING HOLLOW METAL BODIES

(71) Applicants: E. Jennings Taylor, Troy, OH (US); Maria E. Inman, Yellow Springs, OH (US); Timothy Hall, Englewood, OH (US)

(72) Inventors: E. Jennings Taylor, Troy, OH (US); Maria E. Inman, Yellow Springs, OH (US); Timothy Hall, Englewood, OH (US)

(73) Assignee: FARADAY TECHNOLOGY, INC., Englewood, OH (US)

( * ) Notice: Subject to any disclaimer, the term of this patent is extended or adjusted under 35 U.S.C. 154(b) by 491 days.

This patent is subject to a terminal disclaimer.

(21) Appl. No.: 14/585,897

(22) Filed: Dec. 30, 2014

(65) Prior Publication Data

US 2015/0114847 A1 Apr. 30, 2015

Related U.S. Application Data

(63) Continuation of application No. 13/546,072, filed on Jul. 11, 2012, now Pat. No. 9,006,147.

(51) Int. Cl.
*H01L 39/00* (2006.01)
*B23H 3/00* (2006.01)
(Continued)

(52) U.S. Cl.
CPC ............... *B23H 3/00* (2013.01); *C25F 3/26* (2013.01); *H01L 39/2406* (2013.01); *H05H 7/20* (2013.01)

(58) Field of Classification Search
CPC .......... C25F 3/26; H01L 39/2406; H05H 7/20
(Continued)

(56) References Cited

U.S. PATENT DOCUMENTS 2,475,586 A 7/1949 Bartlett
2,861,930 A 11/1958 Robinson
(Continued)

FOREIGN PATENT DOCUMENTS

DE 3032666 3/1982
EP 2873754 5/2015
(Continued)

OTHER PUBLICATIONS

JP, Office Action; Japanese Patent Application No. 2015-521621 (dated Jun. 24, 2016).
(Continued)

*Primary Examiner* — Paul Wartalowicz
(74) *Attorney, Agent, or Firm* — Thompson Hine LLP

(57) ABSTRACT

A method and system for electrochemically machining a hollow body of a metal or a metal alloy. An electrode is positioned within a hollow body including a metal or metal alloy, where the hollow body has a variable internal diameter. The hollow body is oriented vertically, with the electrode oriented vertically therein. The hollow body is at least partially filled with an aqueous, acidic electrolyte solution, the electrolyte solution being devoid of hydrofluoric acid and having a viscosity less than 15 cP. An electric current is passed between the hollow body and the electrode, where the electric current includes a plurality of anodic pulses and a plurality of cathodic pulses, and where the cathodic pulses are interposed between at least some of the anodic pulses.

19 Claims, 13 Drawing Sheets

(51) Int. Cl.
*C25F 3/26* (2006.01)
*H01L 39/24* (2006.01)
*H05H 7/20* (2006.01)

(58) Field of Classification Search
USPC ...................................................... 505/300
See application file for complete search history.

(56) References Cited

U.S. PATENT DOCUMENTS

| | | | |
|---|---|---|---|
| 3,689,388 | A | 9/1972 | Diepers et al. |
| 4,014,765 | A | 3/1977 | Roth et al. |
| 5,171,408 | A | 12/1992 | Thornton |
| 6,217,726 | B1 | 4/2001 | Lorincz et al. |
| 6,402,931 | B1 | 6/2002 | Zhou et al. |
| 6,428,681 | B1 | 8/2002 | Lorincz |
| 6,558,231 | B1 | 5/2003 | Taylor |
| 6,752,882 | B2 | 6/2004 | Lin et al. |
| 7,553,401 | B2 | 6/2009 | Gebhart et al. |
| 9,006,147 | B2 * | 4/2015 | Taylor .................. C25F 3/26 505/300 |
| 2006/0272951 | A1 | 12/2006 | Schmergel et al. |
| 2009/0312186 | A1 | 12/2009 | Norem et al. |
| 2011/0017608 | A1 | 1/2011 | Taylor et al. |
| 2011/0303553 | A1 | 12/2011 | Inman et al. |

FOREIGN PATENT DOCUMENTS

| | | |
|---|---|---|
| JP | 61023799 | 2/1986 |
| JP | 04131400 | 5/1992 |
| JP | 2007276062 | 10/2007 |
| JP | 2011086450 | 4/2011 |
| WO | 2011/156301 | 12/2011 |

OTHER PUBLICATIONS

"Electrochemical deburring results in the sweet smell of success," Cutting Tool News, vol. 2, No. 1, 2 pages (1996).
Calatroni, S. et al., "Status of the EP Simulations and Facilities for the SPL," Proceedings of Linear Accelerator Conference, LINAC2010, Tsukuba, Japan, pp. 824-826 (2010).
Cheh, H.Y, "The Limiting Rate of Deposition by P-R Plating," J. Electrochem. Soc., vol. 118, No. 7, pp. 1132-1134 (Jul. 1971).
Cheh, H.Y., "Electrodeposition of Gold by Pulsed Current," J. Electrochem. Soc., vol. 118, No. 4, pp. 551-557 (Apr. 1971).
Clements, E., "Argonne-Fermilab BCP System Coming Together," ILC NewsLine, www.newsline.linear.collider.org/newsline/readmore_20070104_feature1.html (Jan. 4, 2007).
Cooley, L., "Perfecting Superconducting Niobium for Teravolt and Megawatt Linear Accelerators," Iowa State University Colloquium, Nov. 15, 2010, http://www.event.iastate.edu/event/23106 (accessed Apr. 23, 2011).
Cooley, L.D. et al., "Impact of Forming, Welding, and Electropolishing on Pitting and the Surface Finish of SRF Cavity Niobium," IEEE Transactions on Applied Superconductivity, vol. 21, No. 3, pp. 2609-2614 (Jun. 2011).
Datta, M. et al., "Application of Chemical and Electrochemical Micromachining in the Electronics Industry," Journal of the Electrochemical Society, vol. 136, No. 6, pp. 285C-292C (Jun. 1989).
Datta, M. et al., "Fundamental aspects and applications of electrochemical microfabrication," Electrochimica Acta, 45, pp. 2535-2558 (2000).
*Electroplating Engineering Handbook, Fourth Edition*, ed. L. J. Durney, p. 108, published by Van Nostrand Reinhold, New York (1984).
Éozénou, F. et al., "WP 5.1.1.4: Electropolishing of Niobium: Best EP Parameters," CARE Report 06-010-SRF, EU Contract No. RII3-CT-2003-506395 (2003).
Éozénou, F. et al., "Vertical Electro-Polishing at CEA Saclay: Commissioning of a New Set-Up and Modeling of the Process Applied to Different Cavities," Proceedings of SRF2011, Chicago, Illinois, pp. 549-554 (2011).

Furuta, F. et al., "Multi-Cell VEP Results: High Voltage, High Q, and Localized Temperature Analysis," Proceedings of IPAC2012, New Orleans, Louisiana, pp. 1918-1920 (2012).
Grimm, R.D. et al., "AC Impedance Study of Anodically Formed Salt Films on Iron in Chloride Solution," J. Electrochem. Soc., vol. 139, No. 6, pp. 1622-1629 (Jun. 6, 1992).
Ibl, N. et al., "Electrocrystallization in Pulse Electrolysis," *Surface Technology*, 6, pp. 287-300 (1978).
Ibl, N., "Current Distribution in Pulse Plating," AES Second International Symposium on Pulse Plating, presented by Meetings & Symposia Section, American Electroplaters' Society, Inc., Rosemont, Illinois (Oct. 6-7, 1981).
Inman, M. et al., "Development and Scale-Up of an HF Free Electropolishing Process in Single-Cell Niobium SRF Cavities," presented at the 15th International Conference on RF Superconductivity, Chicago, IL (Jul. 25-29, 2011).
Inman, M. et al., "Niobium Electropolishing in an Aqueous, Non-Viscous HF-Free Electrolyte: A New Polishing Mechanism," presented at the 15th International Conference on RF Superconductivity, Chicago, IL (Jul. 25-29, 2011).
Kozak, J. et al., "The Study of Thermal Limitation of Electrochemical Machining Process," Transactions of NAMRI/SME, vol. XXV, pp. 159-164 (1997).
Landolt, D., "Review Article. Fundamental Aspects of Electropolishing," Electrochimica Acta, vol. 32, No. 1, pp. 1-11 (1987).
Landolt, D., Theory and Practice of Pulse Plating, Puipp, J-C. et al. (eds), "Chapter 5: Mass Transport in Pulse Plating," AESF, Orlando, Florida, pp. 55-71 (1986).
Lavelaine de Maubeuge, H., "Calculation of the Optimal Geometry of Electrochemical Cells Application to the Plating on Curved Electrodes," Journal of the Electrochemical Society, 149 (8), pp. C413-C422 (2002).
Lilje, L. et al., "Achievement of 35 MV/m in the superconducting nine-cell cavities for TESLA," *Nuclear Instruments and Methods in Physics Research A*, 524, pp. 1-12 (2004).
Lozano-Morales, A. et al., "Medical Device Surface Finishing by ECM," *Journal of Applied Surface Finishing* 2 (3), pp. 192-197 (2007).
Lozano-Morales, A. et al., "Variation of Counterelectrode Size to Control Current Distribution in Parallel Plate Cells," *Journal of Applied Surface Finishing*, pp. 34-38 (Mar. 2008).
Mickova, I. et al., "Electrochemical Passivation of Niobium in KOH Solutions," Croatica Chemica Acts, 79 (4), pp. 527-532 (2006).
Newman, J. et al., Electrochemical Systems, Third Edition, John Wiley & Sons, Inc., Hoboken, New Jersey, pp. 420-424 (2004).
Reece, C.E. et al., "Hydrodynamic Thermal Modeling of 9-Cell ILC Cavity Electropolishing and Implications for Improving the EP Process," Proceedings of 13th SRF Workshop, TUP 62, Beijing, China (2007).
Saito, K. et al., "Superiority of Electropolishing over Chemical Polishing on High Gradients," Proceedings of the 1997 Workshop on RF Superconductivity, pp. 795-813, Abano Terme, (Padova), Italy (1997).
Saito, K., "Development of Electropolishing Technology for Superconducting Cavities," Proceedings of the 2003 Particle Accelerator Conference, pp. 462-466 (2003).
Schulz, E. et al., "Engineering Solutions for the Electro-Polishing of Multi-Cell Superconducting Accelerator Structures," The 10th Workshop on RF Superconductivity, 2001, Tsukuba, Japan, pp. 481-484.
Sun, J.J. et al., "Electrically Mediated Edge & Surface Finishing for Automotive, Aerospace & Medical Applications," Plating & Surface Finishing, pp. 94-99 (May 2002).
Sun, J.J. et al., "MREF-ECM process for hard passive materials surface finishing," *Journal of Materials Processing Technology*, 108, pp. 356-368 (2001).
Taylor, E.J. et al., "A Pulse/Pulse Reverse Electrolytic Approach to Electropolishing and Through-Mask Electroetching," Products Finishing Magazine Online, www.pfonline.com/articles/a-pulsepulse-reverse-electrolytic-approach-to-electropolishing-and-through-mask-electroetching (Sep. 26, 2011).

(56) References Cited

OTHER PUBLICATIONS

Taylor, E.J. et al., "Electrically Mediated Plating of Semiconductor Substrates, Chip Scale Packages & High-Density Interconnect PWBs," Plating & Surface Finishing, pp. 88-93 (May 2002).

Taylor, E.J., "Adventures in Pulse/Pulse-Reverse Electrolytic Processes: Explorations and Applications in Surface Finishing," Journal of Applied Surface Finishing, 3 (4), pp. 178-189 (2008).

Tian, H. et al., "Quantitative EP Studies and Results for SRF Production," presented at the 15th International Conference on RF Superconductivity, Chicago, IL (Jul. 25-29, 2011).

Tian, H. et al., "The Mechanism of Electropolishing of Niobium in Hydrofluoric-Sulfuric Acid Electrolyte," *Journal of The Electrochemical Society,* 155 (9), pp. D563-D568 (2008).

Vidal, R. et al., "Copper Electropolishing in Concentrated Phosphoric Acid. I. Experimental Findings," J. Electrochem. Soc., vol. 142, No. 8, pp. 2682-2689 (Aug. 1995).

Vidal, R. et al., "Copper Electropolishing in Concentrated Phosphoric Acid. II. Theoretical Interpretation," J. Electrochem. Soc., vol. 142, No. 8, pp. 2689-2694 (Aug. 1995).

Viswanathan, K. et al., "The Application of Pulsed Current Electrolysis to a Rotating-Disk Electrode System, I. Mass Transfer," J. Electrochem. Soc., vol. 125, No. 11, pp. 1772-1776 (Nov. 1978).

West, A.C. et al., "Current Distributions on Recessed Electrodes," J. Electrochem. Soc., vol. 138, No. 6, pp. 1620-1625 (Jun. 1991).

West, A.C. et al., "Electrochemical planarization of interconnect metallization," IBM J. Res. & Dev., vol. 49, No. 1, pp. 37-48 (Jan. 2005).

West, A.C. et al., "Electrohydrodynamic impedance study of anodically formed salt films on iron in chloride solutions," J. Electroanal. Chem., 330, pp. 693-706 (1992).

Wu, A.T. et al., "Smooth Nb surfaces fabricated by buffered electropolishing," Applied Surface Science, 253, pp. 3041-3052 (2007).

Yin, K.-M., "Duplex diffusion layer model for pulse with reverse plating," Surface and Coatings Technology, 88, pp. 162-164 (1996).

International Search Report and Written Opinion, International Application No. PCT/US2013/045056 (dated Nov. 8, 2013).

U.S., Non-Final Office Action; U.S. Appl. No. 13/546,072 (dated Mar. 28, 2014).

U.S., Final Office Action; U.S. Appl. No. 13/546,072 (dated Nov. 21, 2014).

U.S., Notice of Allowance; U.S. Appl. No. 13/546,072 (dated Dec. 11, 2014).

EP, Extended European Search Report, Patent Application No. 13823112.1 (dated Oct. 26, 2015).

\* cited by examiner

ELECTROCHEMICAL SYSTEM AND METHOD FOR ELECTROPOLISHING HOLLOW METAL BODIES

CROSS-REFERENCE TO RELATED APPLICATIONS

This application is a continuation application of U.S. patent application Ser. No. 13/546,072, filed Jul. 11, 2012, the entirety of which is incorporated by reference herein.

GOVERNMENT RIGHTS

This Disclosure was developed under DOE Fermi National Accelerator Laboratory Purchase Order Number 594128.

FIELD

This application relates to electrochemical machining or polishing of hollow bodies of metals and metal alloys and, more particularly, to surface finishing superconductive radio frequency (SCRF) cavities such as cavities of the type used in supercolliders.

BACKGROUND

The most common fabrication technology for SCRF cavities is to form thin walled (e.g., about 1 to 3 mm) shell components from high purity niobium sheets by stamping. These shell components are welded together to form hollow cavities. Horizontal processing of horizontally situated cavities as described in U.S. Pat. No. 4,014,765 (Siemens Corporation) was developed to avoid the adverse effects of gas pockets and bubble entrainment that lead to nonuniform electropolishing. A schematic illustration of an apparatus for conducting horizontal processing of SCRF cavities is shown in FIG. 10. The SCRF cavity 100 is oriented horizontally and mounted on a pair of rotatable end caps 120. One of the end caps includes a circumferential electrically conductive surface 140. A cathode 160 passes through the cavity 100. In the illustrated embodiment, the SCRF cavity includes a single cell which is schematically represented by the large diameter portion in the middle of the body shown in the figure. The cathode 160 is electrically connected to a rectifier 400 by the cathode lead 440. The anode lead 420 of the rectifier 400 is connected to the rotating conductive surface 140 which is electrically connected to the SCRF cavity 100. The cavity 100 is partially filled with a viscous electrolyte 320. The electrolyte 320 is supplied from a tank 300 via the electrolyte feed tube 340 which dispenses the electrolyte to the cavity 100. The electrolyte is continuously circulated through the cell 100. It leaves the cell through a return tube 360. The volume above the electrolyte 320 in the cell 100 contains gas generated during the electropolishing process. This gas is purged from this space by means of a vent shown schematically at 220. The gas purge 200 is introduced at the end cap 120A on the opposite end of the cell 100. The cavity is rotated on the end blocks 120 as shown by the directional arrow A in the figure.

One of the vehicles that is often used in electropolishing passivating metals like niobium is hydrofluoric acid. As explained herein, the electrolytes used with these passivating metals tend to be highly viscous and this can leading to the gas entrainment difficulties that have required the use of the horizontal processing design discussed above. Accordingly, there is a need for a method for polishing niobium and other strongly passivating metals, particularly for use in surface finishing SCRF cavities, that does not require the use of highly viscous electrolytes.

As explained in detail in U.S. Published Application No. 2011/0303553 to Inman electrochemical polishing or electrolytic polishing or electropolishing is a process whereby metal ($M^0$) is selectivity removed from a surface by an electrochemical reaction, generally of the form $$M^0 \rightarrow M^{n+} ne^- \qquad \text{Eq. 1}$$

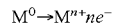

As illustrated in FIG. 1, during electropolishing, the current distribution is controlled so that the peaks or asperities of the surface are preferentially removed relative to the recesses or valleys in the subject surface. In the case of primary or geometric current distribution as depicted in FIG. 2, the resistive path length from the cathode to the surface asperity ($\Omega p$) is shorter than the distance from the cathode to the recess ($\Omega r$). Consequently, the peaks are preferentially dissolved. The difference in the current distribution between the peak and recess is greater as the electrolyte resistance increases. Highly resistive electrolytes and low electrolyte temperatures are desirous to increase the differential between the current at the peak and the recess. Decreasing temperature increases resistivity.

In the case of tertiary or mass transport controlled current distribution as depicted in FIG. 3, the diffusion distance from the peak to the bulk solution (Dp) is less than the diffusion distance from the recess to the bulk solution (Dr). Since one skilled in the art would understand that the diffusion limited current is based on either dissolved metal ions diffusing away from the peaks or acceptor ions diffusing to the peaks, the diffusion limiting current for metal dissolution at the peaks is higher than the diffusion limiting current at the recesses. Consequently the peaks are preferentially dissolved. The difference in the diffusion limited current distribution between the peaks and recesses is higher for viscous solutions. Viscous solutions have the effect of slowing down the diffusion process. Consequently, highly viscous electrolytes (e.g., about 15 to 30 cP) and low temperatures (e.g., 10° C. to 30° C.) leading to higher viscosity are able to increase the differential between the current at the peak and the recess. Consequently, electropolishing solutions used in the systems discussed above are generally highly resistive (e.g., 10 mS/cm to 200 mS/cm) and high viscosity (e.g., about 15 cP to 30 cP) solutions, in some cases operating at low temperatures as disclosed by D. Ward "Electropolishing" in *Electroplating Handbook* ed. L. Durney 4$^{th}$ edition pg. 108, Van Nostrand Reinhold, N.Y. (1984).

Despite the obstacles presented by strongly-bonded passivation layers, various techniques have been developed for electrochemically processing such metals as niobium and niobium alloys. In addition to highly resistive and high viscosity electrolytes, these techniques typically require high voltages and/or hydrofluoric acid in the electrolyte solution. The electrochemical conditions which drive the reaction shown in Eq. 1 above also drive the following reaction which results in the formation of passivating oxides.

$$M^0 + xH_2O \rightarrow MOx + 2xH^+ + 2xe^- \qquad \text{Eq. 2}$$

By electropolishing in non-aqueous or minimally aqueous electrolytes, the source of the oxygen that forms these passivating oxides is eliminated. However, maintaining low water content presents an additional set of control challenges. Using reverse current pulse conditions in accordance with this disclosure provides the means to manage the formation of this layer of passivating oxides, even in the presence of substantial water, so that the oxides do not interfere with electropolishing.

SUMMARY

One manifestation of this disclosure is a method for electropolishing SCRF cavities using relatively low viscosity hydrofluoric acid free electrolytes that enable one to process the cavities without gas entrainment. In accordance with another manifestation, the SCRF cavities can be processed in a vertical orientation. Another manifestation of the disclosure is a process that does not require cavity rotation or the need to purge gases and that may overcome other disadvantages of the horizontal processing system disclosed in U.S. Pat. No. 4,014,765. Another manifestation is a process for polishing hollow niobium bodies that may lead to a cost effective, scalable, high yield process to meet the demand for SCRF cavities.

According to this disclosure, an electrically mediated approach is used to eliminate the need for hydrofluoric acid and/or fluoride salts and to reduce the effect of hydrogen in finishing the highly passive metal surfaces of SCRF cavities. The electrically mediated process is environmentally benign and retains the advantages of electrochemical processes in terms of speed and investment. Depending on the flow rate of the electrolyte across the work piece, a waveform is selected to polish the surface. As the surface roughness is reduced and macroroughness is reduced to microroughness, the waveform may be changed as required. These distinct waveforms can be preprogrammed into the rectifier.

In another aspect, the disclosed method may include the steps of positioning an hydrofluoric acid free electrolyte solution that may optionally be an aqueous electrolyte solution between a workpiece and an electrode, and passing an electric current between the workpiece and the electrode, wherein the electric current is comprised of anodic pulses and cathodic pulses, and wherein the cathodic pulses are interposed between at least some of the anodic pulses.

In another aspect the electrolyte solution contains a surfactant such as Triton-X to facilitate the release of oxygen bubbles generated in the electrolytic process.

Other aspects of the disclosed electrochemical machining system and method will become apparent from the following description, the accompanying drawings and the appended claims.

DETAILED DESCRIPTION

U.S. Published Application 2011/0303553 to Inman is incorporated herein by reference.

As used herein, "electrochemical machining" broadly refers to any electrochemical process that involves the removal of material from a workpiece, regardless of the extent of removal. For example, electrochemical machining includes electrochemical polishing, electrochemical etching, electrochemical through-mask etching, electrochemical shaping and electrochemical deburring, among other processes.

As used herein the term "hydrofluoric acid free" includes electrolytes that may be formulated to be substantially free of fluoride acids and salts as well as hydrofluoric acid.

Figure 10:
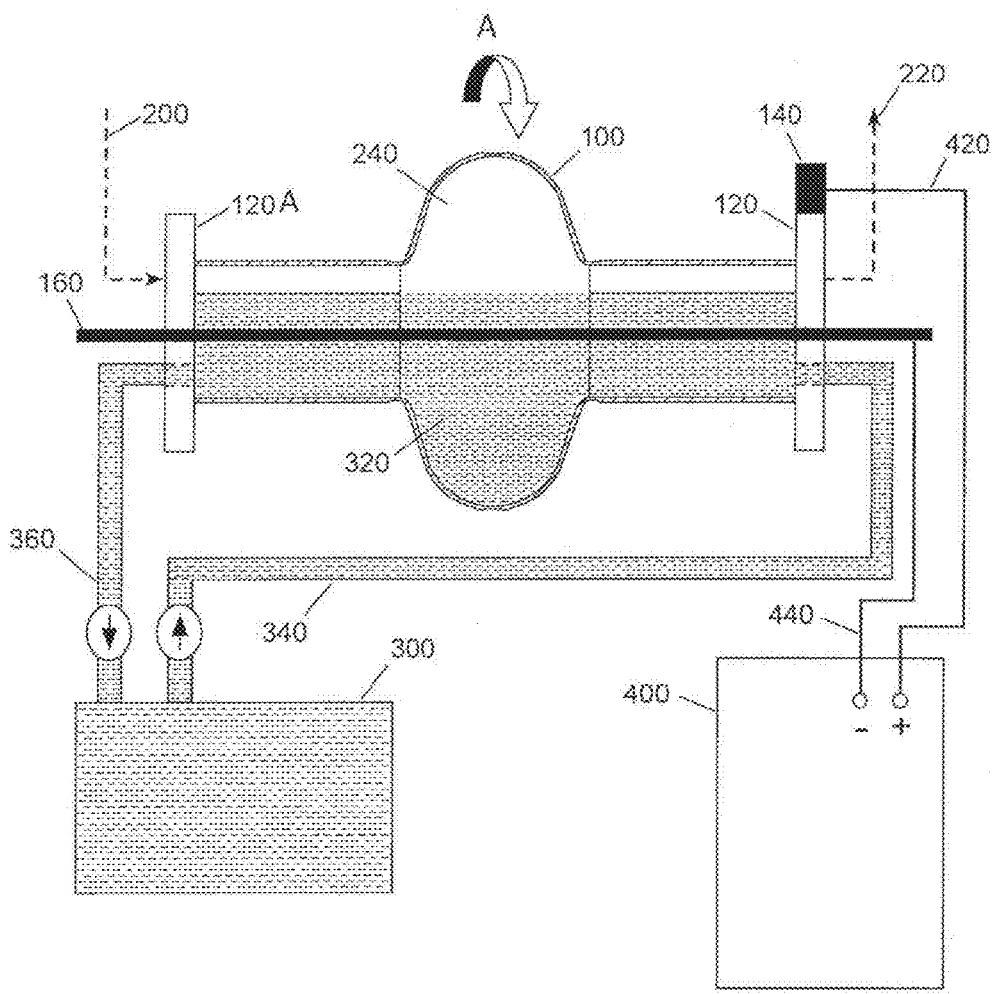
FIG. 10 is a schematic of an electropolishing apparatus for horizontal processing as disclosed in the prior art.
Figure 11:
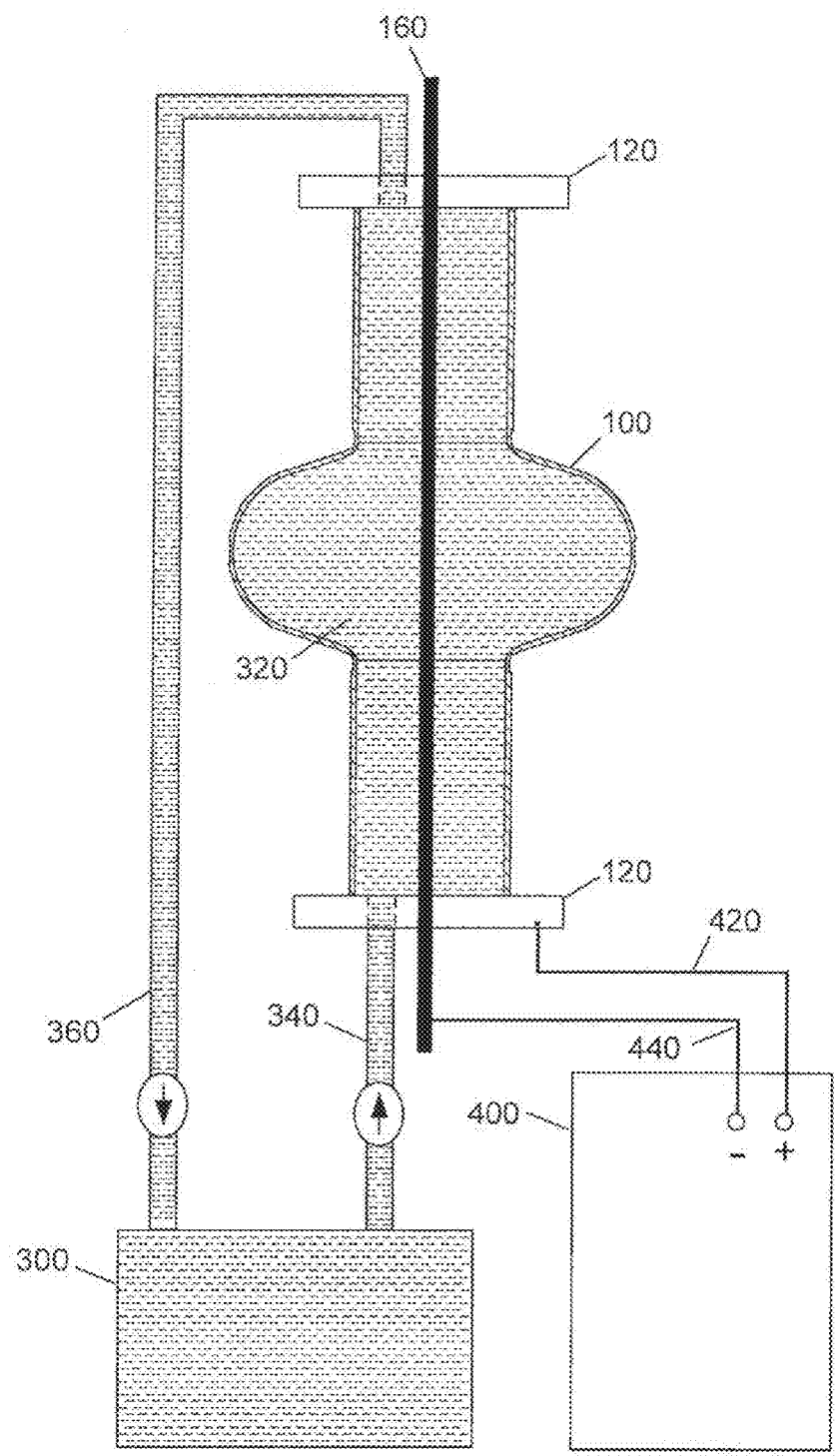
FIG. 11 is a schematic of an electropolishing apparatus for vertical processing a SCRFC in accordance with one embodiment.
Figure 12:
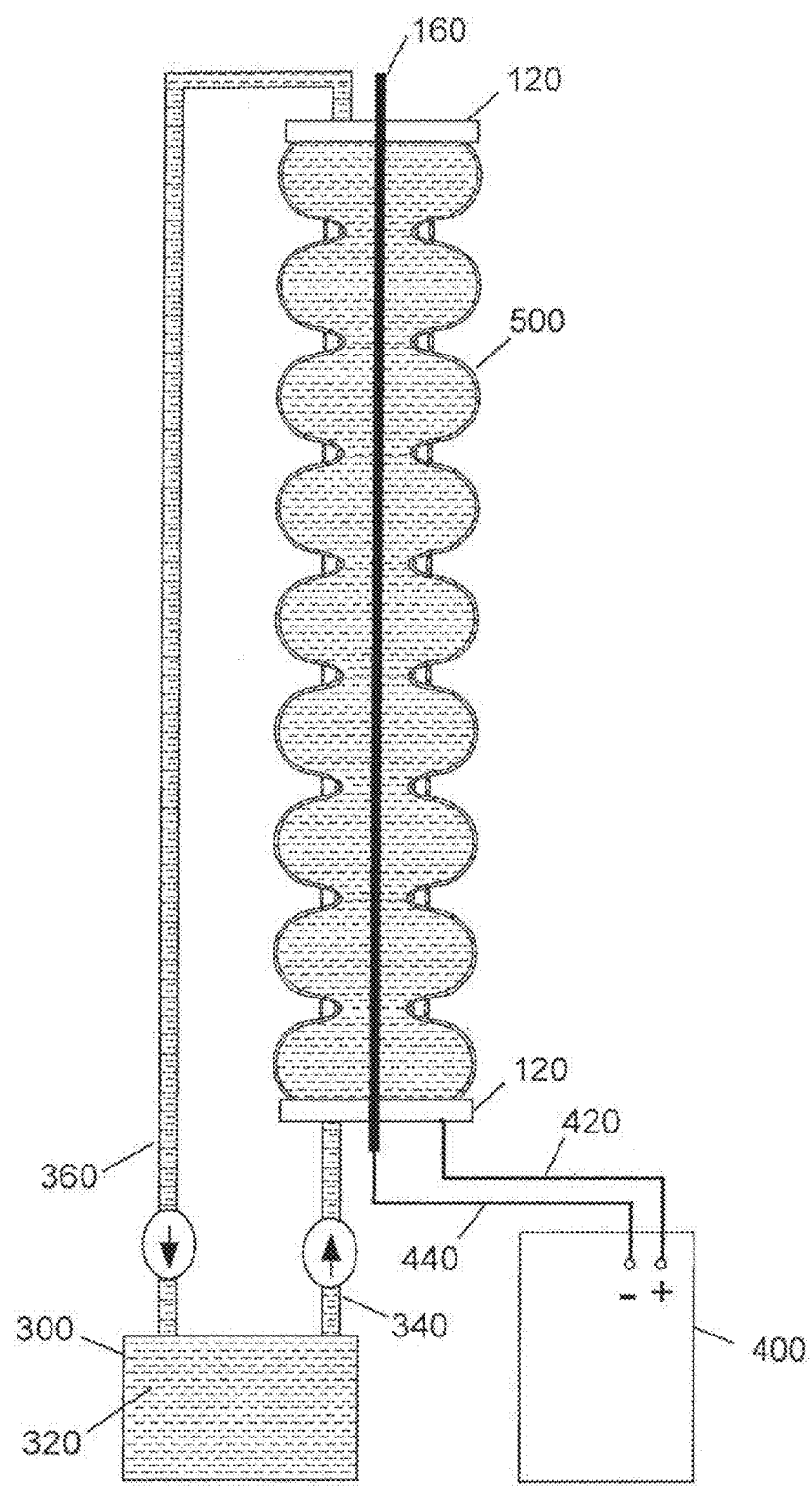
FIG. 12 is a schematic of an electropolishing apparatus for vertical processing a multi-cavity SCRFC in accordance with another embodiment.

FIGS. 11 and 12 illustrate schematically two embodiments of the invention wherein the superconducting radio frequency cavity is vertically oriented and electropolished. In FIG. 11, the cavity 100 includes a single cell (similar to FIG. 10) whereas in FIG. 12, the cavity 500 includes multiple (nine) cells. A cathode 160 is vertically oriented in the cells 100 and 500 and is retained by the end blocks 120. The end blocks 120, unlike the end blocks shown in FIG. 10, are not designed to rotate nor do they include means for purging gas generated during the electropolishing process. This is unnecessary because at the viscosities used, the oxygen gas generated during processing is readily dispersed in the electrolyte such that it does not interfere with the surface finishing process. The cathode 160 is electrically connected to the cathode 440 of the rectifier 400. The cell 100/500 is electrically connected to the anode 420 of the rectifier 400 by the end plate 120. The electrolyte 300 is introduced to the bottom of the cavity 100/500 by a feed tube 340 from the electrolyte supply tank 300. At the top of the cavity 100/500, electrolyte is expelled from the cavity through the end cap 120 through the electrolyte return tube 360.

The flow of the electrolyte through the cavity is adjusted such that the electrolyte is refreshed during the electropolishing process.

The power source or rectifier is configured to pass an electric current between the electrode and the workpiece, wherein the electric current is comprised of anodic pulses and cathodic pulses, and wherein the cathodic pulses are interposed between at least some of the anodic pulses. The electrolyte is characterized in that it is hydrofluoric acid and/or fluoride salt free. In one embodiment it is an aqueous solution of sulfuric acid at concentrations of 70% by weight and less. In certain embodiments, the amount of water in the electrolyte may be greater than 5% by weight, or greater than 10%, or greater than 20%, or greater than 70%.

The electrolyte solution disclosed herein may be used with an anodic pulse-cathodic pulse waveform to electrochemically machine niobium and alloys thereof, as well as other metals and metal alloys, including other metals and metal alloys that tend to have strongly bonded passivation layers. For example, the disclosed electrolyte solution may be used with an anodic pulse-cathodic pulse waveform to electrochemically machine niobium and niobium alloys, titanium and titanium alloys (such as titanium and molybdenum alloys, and titanium and nickel alloys also know as nitinol), zirconium and zirconium alloys, hafnium and hafnium alloys, tantalum and tantalum alloys, molybdenum and molybdenum alloys, and tungsten and tungsten alloy. In another embodiment the process may be used to polish cobalt chrome alloys of a type used in medical applications such as vascular and other stents.

The disclosed hydrofluoric acid free electrolyte solution in one embodiment may be an electrolyte having a low viscosity such as a viscosity of about 1 cP to 15 cP or about 1 cP to 8 cP, or about 1 cP to 4 cP. In a particular embodiment it may be an aqueous solution comprised of low concentrations of sulfuric acid, for example, concentrations of about 1% by weight to 70% by weight, more particularly about 15% by weight to 40% by weight, still more particularly about 20% by weight to 40% by weight. In other embodiments of the invention, other acidic, hydrofluoric acid and fluoride acid and salt free electrolytes may be used such as combinations of sulfuric/chromic/phosphoric acids, phosphoric/chromic acids, phosphoric/sulfuric acids, phosphoric acid, phosphoric/sulfuric/chromic acids, phosphoric/sulfuric/hydrochloric acids, sulfuric/glycolic acids, phosphoric/sulfuric acids, sulfuric/chromic acids, sulfuric/citric, and others. Generally, it will be desirable to select electrolytes having a high conductivity such as greater than 200 mS/cm, or greater than 400 mS/cm, or greater than 600 mS/cm or greater than 800 mS/cm.

In one implementation of the invention, aqueous electrolytes containing substantial water as disclosed above may be use. However, another implementation may employ non-aqueous or minimally aqueous electrolytes containing less than 15%, less than 10% or less than 5% water. When water-containing electrolytes are used, oxygen is generated according to the equation:

$$H_2O \rightarrow 2H^+ O_2 + 2e^-$$  Eq. 3

It has been found that the addition of a surfactant facilitates electropolishing. One possible reason for this that the surfactant promotes the formation of small bubbles that do not interfere with the diffusion process by stirring the electrolyte. Conventional surfactants may be used for this purpose such as Triton X (polyethylene glycol p-(1,1,3,3-tetramethylbutyl)-phenyl ether), a product of Rohm and Haas, in conventional amounts.

Figure 4:
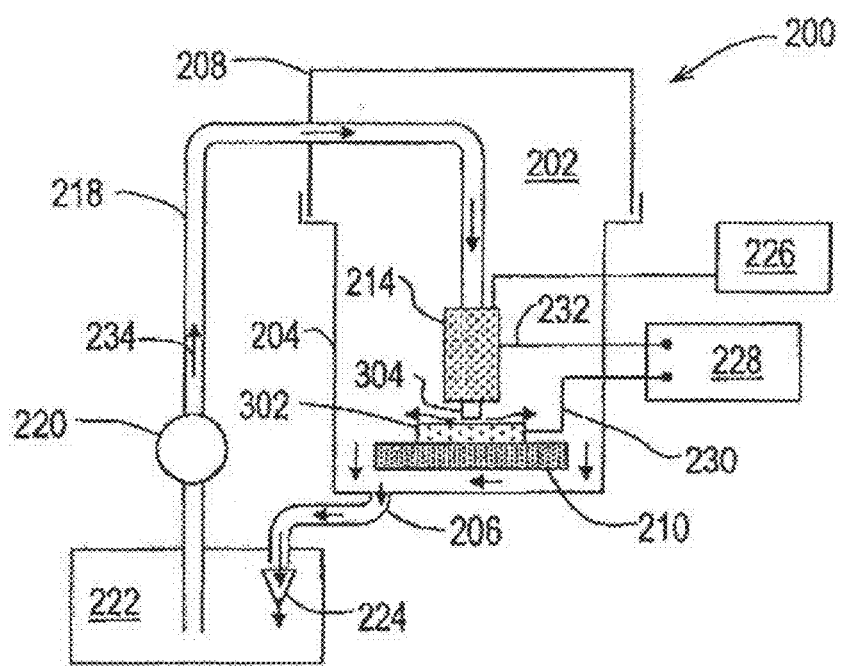
FIG. 4 is a schematic illustration of one particular implementation of the disclosed electrochemical machining system.

Referring to FIG. 4, one particular implementation of the disclosed electrochemical machining system, generally designated 200, may include a working chamber 202 defined by a tank 204 and a cover 208, an electrolyte holding tank 222, a conduit 218, a pump 220, an electrode 304, a workpiece 302, a power source 228 and the disclosed electrolyte solution. The working chamber 202 may be in fluid communication with the electrolyte holding tank 222 by way of a gravity drain 206. A filter 224 may be associated with the drain 206 to filter the electrolyte solution flowing from the working chamber 202 to the electrolyte holding tank 222. The working chamber 202 may also be in fluid communication with the electrolyte holding tank 222 by way of the conduit 218, wherein the pump 220 may pump the electrolyte solution from the electrolyte holding tank 222 to the working chamber 202, as shown by arrow 234.

Within the working chamber 202, a workpiece holder 210 may be mounted near the bottom of the tank 204 with adequate spacing from the walls and bottom of the tank 204 to allow for drainage of the electrolyte solution into the electrolyte holding tank 222. The workpiece 302 may be supported on the workpiece holder 210 and may be connected to a first electrical lead 302 of the power source 228.

The workpiece 302 may be any apparatus or thing capable of being electrochemically machined. In one embodiment the work piece can be a medical stent. In another embodiment it may be a dental implant. In another embodiment it may be RF superconducting cavities that are components of linear particle accelerators. In a first expression, the workpiece 26 may be any apparatus or thing that is formed from or includes a metal or a metal alloy. In a second expression, the workpiece may be any apparatus or thing that is formed from or includes a metal or a metal alloy that forms a strongly-bonded passivation layer. Examples of metals that form strongly-bonded passivation layers include niobium, titanium and tantalum. In a third expression, the workpiece may be any device that is formed from or includes niobium or a niobium alloy. For example, the workpiece may be a niobium structure or a portion of a niobium structure that defines RF superconducting cavities in a particle accelerator. In a fourth expression, the workpiece may be any apparatus or thing that is formed from or includes titanium or a titanium alloy. For example, the workpiece may be a nitinol tube coated with a resist material, wherein the resist material is patterned to define a surgical stent after electrochemical machining. In another expression the workpiece may be any device that is formed from or includes cobalt chromium alloy.

An electrode holder 214 may be positioned in the working chamber 202 above the workpiece holder 210. The electrode holder 214 may be supplied with the electrolyte solution by way of the conduit 218. The electrode 304 may be connected to a second electrical lead 232 (opposite polarity than the first electrical lead 302) of the power source 228 and may be supported by the electrode holder 214 such that the tool holder 214 may move the electrode 304 in a vertical axis under control of an electrode feed controller 226.

In one particular aspect, the electrode 304 may include a central bore and the electrode 304 may be connected to the electrode holder 214 such that the central bore of the electrode 304 is directed at the workpiece 302. During electrochemical processing, the electrolyte solution may be pumped by pump 220 from the electrolyte holding tank 222 to the electrode holder 214 and, ultimately, to the electrode 304 by way of the conduit 218. The rate of the electrolyte solution flow is herein referred to as $E_v$. The electrolyte solution may flow through the central bore of the electrode 304 and may exit between the electrode 304 and the workpiece 302 before returning to the electrolyte holding tank 222 by way of the drain 206. The power source 228 may supply electric current to the workpiece 302 and the electrode 304 by way of the first and second electrical leads 230, 232 in accordance with the disclosed anodic pulse-cathodic pulse waveform.

The spacing between the electrode and workpiece 302 during processing may be considered an optimizeable parameter and may depend on the composition of the electrolyte solution and the type of electrochemical machining process being performed, among other factors. For example, the spacing between the electrode and workpiece may range from about 0.5 to 20 millimeters or more particularly 0.5 to 10 millimeters for an electrochemical shaping process, about 5 to about 12 millimeter for an electrochemical polishing process and about 5 to about 50 millimeters for an electrochemical deburring process.

Figure 5A:
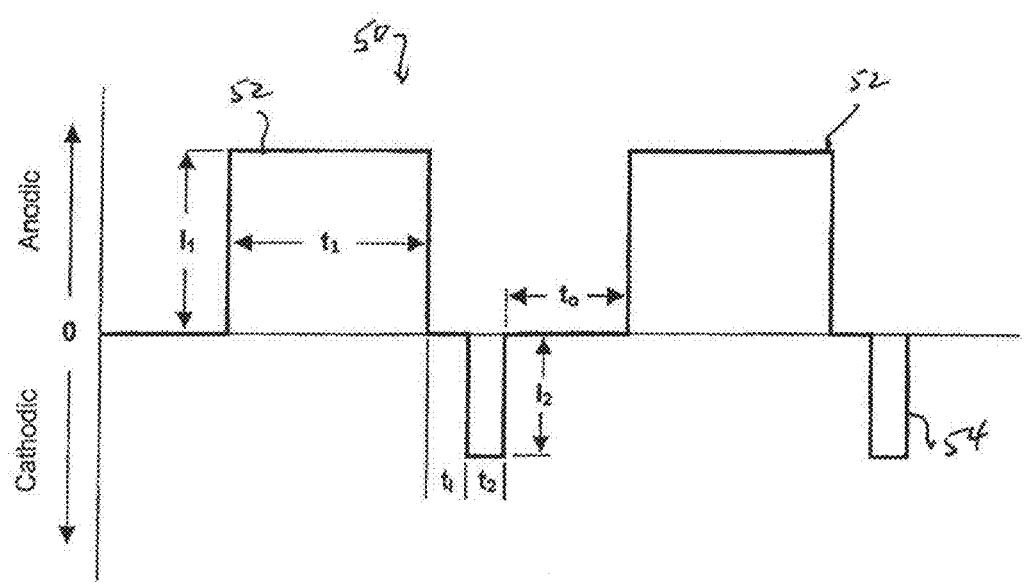
FIGS. 5A and 5B are graphical illustrations of anodic pulse-cathodic pulse waveforms used in connection with the electrochemical machining system of FIG. 4.
Figure 5B:
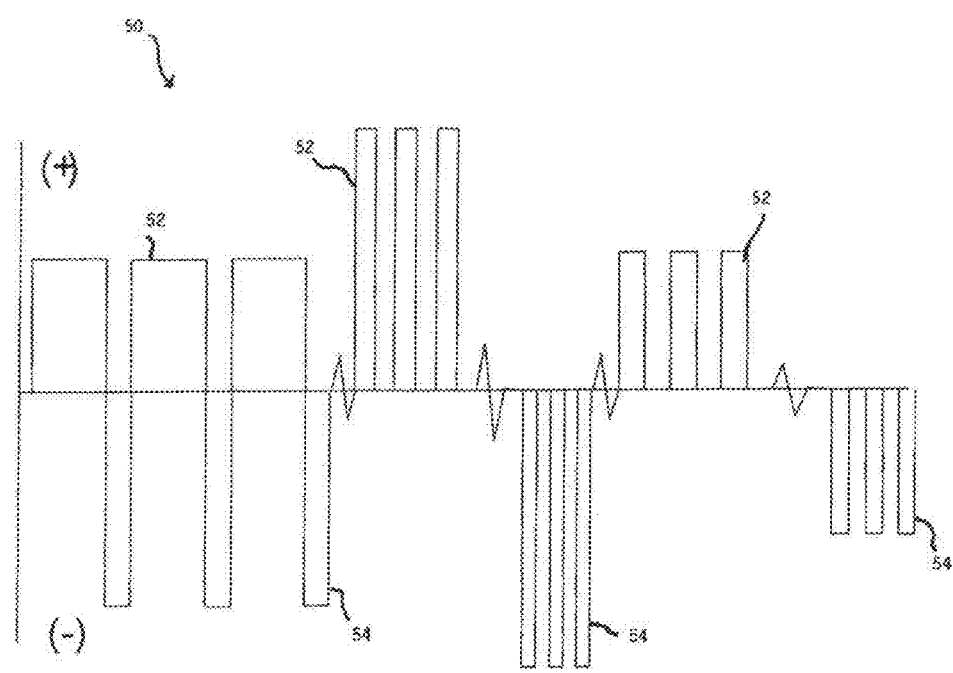

As shown in FIG. 5A, an anodic pulse-cathodic pulse waveform, generally designated 50, may include a plurality of anodic pulses 52 and a plurality of cathodic pulses 54. One particular implementation is shown in FIG. 5B.

The period T of the waveform is the sum ($T=t_1+t_2+t_o+t_i$) of the anodic on-time $t_1$, cathodic on-time $t_2$, relaxation period $t_o$ and intermediate period $t_i$. The inverse (1/T) of the period T of the waveform is the frequency f of the waveform. The ratio ($t_1/T$) of the anodic on-time $t_1$ to the period T is the anodic duty cycle $D_1$ and the ratio ($t_2/T$) of the cathodic on-time $t_2$ to the period T is the cathodic duty cycle $D_2$. The current density (i.e., current per unit area of the electrode) during the anodic on-time $t_1$ and cathodic on-time $t_2$ may be referred to as the anodic peak pulse current density and cathodic peak pulse current density, respectively. The anodic charge transfer density $Q_1$ is the product ($I_1t_1$) of the anodic current density $I_1$ and the anodic on-time $t_1$, while the cathodic charge transfer density $Q_2$ is the product ($I_2t_2$) of the cathodic current density $I_2$ and the cathodic on-time $t_2$.

In a first expression of the anodic pulse-cathodic pulse waveform, the anodic peak current $I_1$ may range from about 2 to 6 A/cm$^2$, the cathodic peak current $I_2$ may range from about 8 to 15 A/cm$^2$.

In one embodiment, the voltage and on-time of the anodic pulse is adjusted to remove metal from the micropeaks in the surface via Eq. 1 above without accumulating a passivating layer thickness via Eq. 2 above that cannot be effectively removed during the cathodic duty cycle. Accordingly, the anodic voltage and on-time are adjusted to oxidize the metal on the micropeaks while generating only that amount of passivating oxides that can be removed by the cathodic pulse. If the passivating oxide layer cannot be removed, it prevents or terminates polishing. The appropriate conditions will vary depending on the nature of the metal. In one embodiment a relatively short anodic pulse $t_1$, typically from about 0.01 ms to about 100 ms, preferably from about 0.05 ms to about 10 ms, and an anodic duty cycle from about 1 to 60% or from about 5% to about 60%, preferably from about 1 to 40% or from about 10% to about 40%. The cathodic pulse $t_2$ may have a pulse width from about 0.01 ms to about 900 ms, preferably from about 0.1 ms or from about 0.5 ms to about 90 ms, and a duty cycle from about 40% to about 99% or about 95%, preferably from about 60% to about 99% or about 90%. The relaxation period $t_o$ may range from about 0 to about 600 s and the intermediate off period $t_i$ may range from about 0 to about 1000 ms. The frequency f of the waveform 50 may range from about 1 Hertz to about 5000 Hertz, preferably from about 10 Hz to about 2000 Hz and more preferably from about 100 Hz to about 2000 Hz or about 100 Hz to 1000 Hz.

Figure 1:
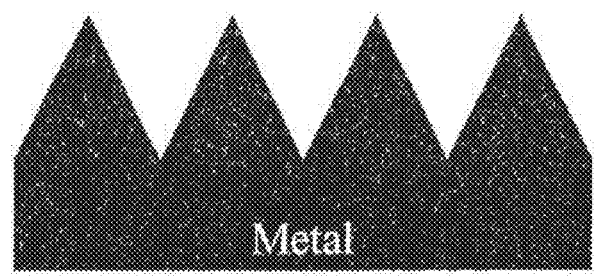
FIG. 1 is a schematic representation of electropolishing.
Figure 1:
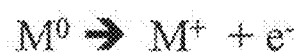
Figure 1:
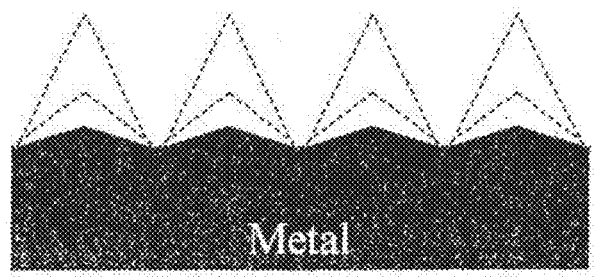
Figure 2:
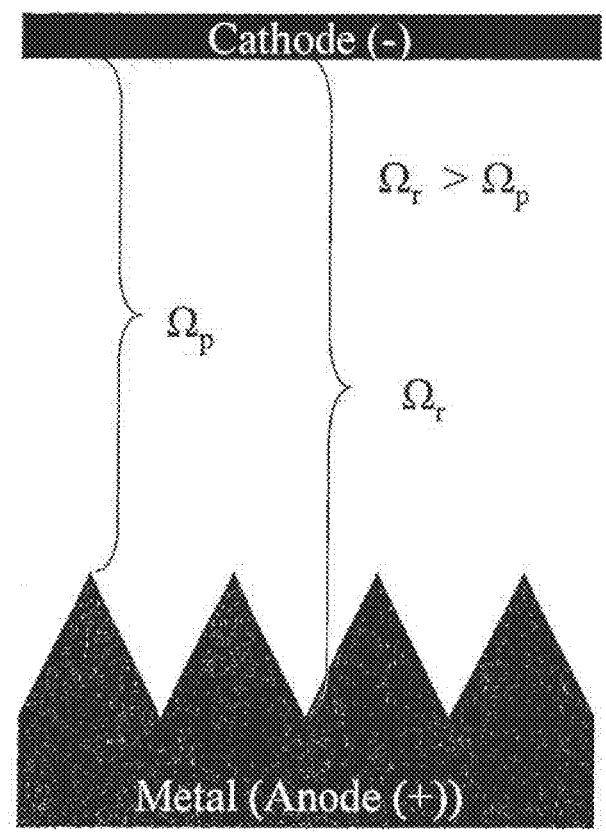
FIG. 2 is a schematic representation of electropolishing with resistive electrolytes.
Figure 3:
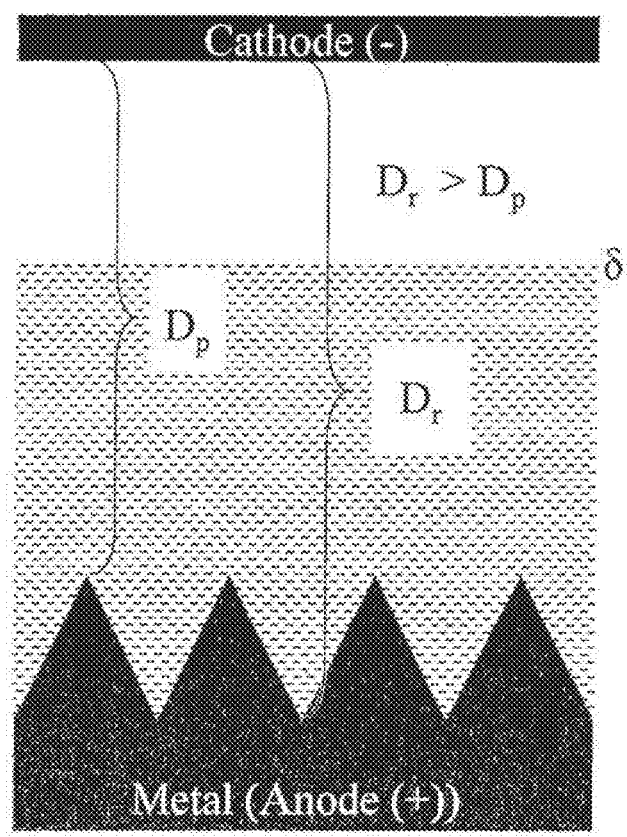
FIG. 3 is a schematic representation of electropolishing with viscous electrolytes.

At this point, those skilled in the art will appreciate that the parameters of the pulse waveform 50 can be selected to provide uniform metal removal from the workpiece and thereby provide more accurate conformity of the workpiece. Additionally, the field can be implemented to reduce or anodically consume some of the hydrogen generated at the workpiece surface and reduce or eliminate the effects of a nonuniform oxide film. The anodic peak current $I_1$, the anodic on-time $t_1$, the cathodic peak current $I_2$, the anodic on-time $t_2$, the relaxation period $t_o$ and the intermediate off period $t_i$, may be varied depending on the composition of the workpiece 26, the composition of the electrode, the composition of the electrolyte solution and the type of electrochemical machining process being performed, among other factors to achieve these objectives. Furthermore, those skilled in the art will appreciate that the voltage and current may be proportional under the circumstances of the disclosed system and method and, therefore, the ordinate in FIG. 2 could represent either current or voltage, although it is generally more convenient in practice to control the voltage. Furthermore, the waveform 50 need not be rectangular as illustrated. The anodic pulses and the cathodic pulses may have any voltage-time (or current-time) profile. Rectangular pulses are assumed merely for simplicity. Again, one skilled in the art will recognize that the point in time chosen as the initial point of the pulse train is entirely arbitrary. Either the anodic pulse or the cathodic pulse (or any point in the pulse train) could be considered as the initial point. The representation with the anodic initial pulse is introduced for simplicity in discussion. In accordance with one embodiment, the cathodic voltage is about 4 to 40 volts or about 4 to 15 volts or about 8 to 35 volts or about 6 to 12 volts, and in one embodiment about 35 volts. This is in contrast to processes in which the workpiece is not made from a strongly passivating metal in which case a cathodic voltage of 4 volts or less may be satisfactory. The cathodic voltage is used to depassivate the surface, and for strongly passivating materials the cathodic voltage needs to be greater than 4 volts, one skilled in the art can determine the anodic voltage required for the desired electrochemical dissolution, i.e. etching and/or polishing.

Without being limited to any particular theory, it is believed that the introduction of cathodic pulses between the anodic pulses has the effect of cathodically consuming the nascent oxygen or cathodically reducing the oxide film, thereby reducing or eliminating the adverse effects due to the formation of a non-uniform oxide film. Consequently, when the next anodic pulse is applied, any passive layer that may have formed will be more easily broken down, and therefore less capable of forming local islands of passivity that tend to resist erosion of the underlying metal.

EXAMPLES

Niobium foil, 99.9% pure, was purchased from GoodFellow (GoodFellow, Oakdale, Pa.) (FIG. 131) and cut into two different coupon sizes to use for the electropolishing studies. Final coupon sizes had the following dimensions: 1) 25.4 mm×25.4 mm×3 mm, and 2) 30 mm×10 mm×3 mm.

Figure 6:
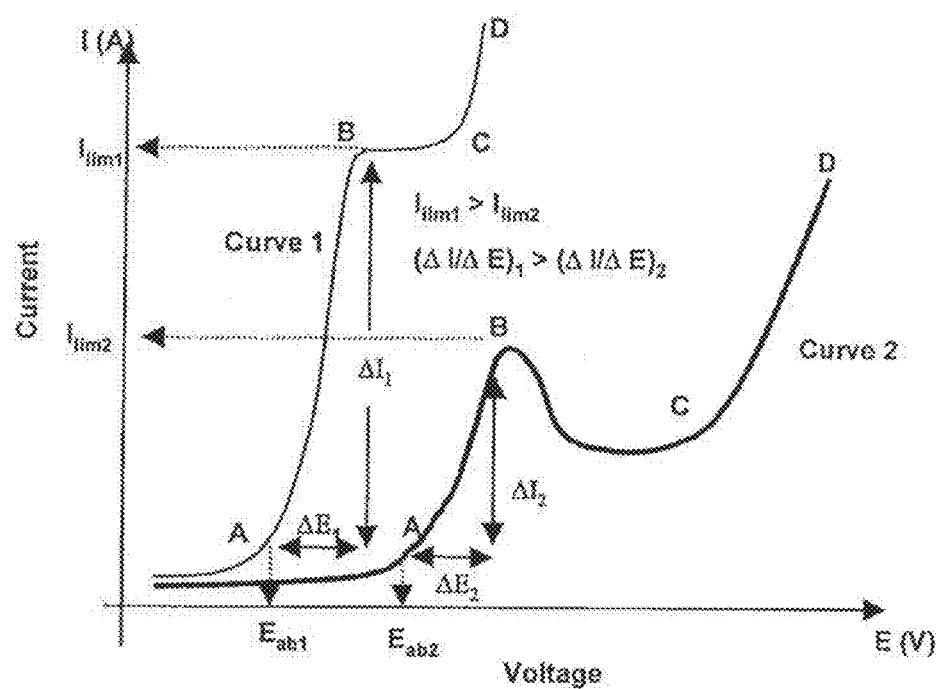
FIG. 6 is an example of polarization curves for metal in different electrolytes.

As a simple, efficient, and cost-effective screening method, the polarization curve can be used to select candidate electrolytes. In FIG. 6, curve 1 shows the behavior of an active metal, and curve 2 shows the behavior of a passivated metal. Before the electric field is applied, the metal anode immersed in the electrolyte has a steady-state voltage ($E_{ss}$). When the power is applied, the electrode voltage will shift in the positive direction from $E_{ss}$ to $E_{ab}$ (the breakdown voltage). Above $E_{ab}$, the current density rises abruptly due to the dissolution reactions occurring on the anode (region AB). The dissolution rate of the anode metal stops increasing when a limiting current density $I_{lim}$ is reached (BC region), where the metal atoms form metal ions and compounds with the activating anions and pass into the electrolyte. The limiting current density $I_{lim}$ and the ratio of ΔI to ΔE (the slope of AB on the polarization curve) can be defined as the metal dissolution rate and current efficiency in the electrolyte, respectively. In region BC, the current density remains constant (curve 1) or drops to a lower value (curve 2) indicating mass transport phenomena that limit the rate of metal ion removal. The products of metal dissolution reach their solubility limit and form a loose deposit or passive film on the electrode surface. If the metal dissolution is conducted in a passive electrolyte, the passive film can grow faster than metal ions pass into the electrolyte, with the result that the current density falls to lower values (curve 2). Generally, the limiting current decreases with increasing electrolyte concentration, due to the decrease in the solubility of the reaction products. Since the limiting current is strongly related to diffusion, it can be increased in the pulse/pulse reverse process by increasing the electrolyte flow rate. When the anode voltage increases to region CD of the polarization curve, the higher voltage can breakdown or remove the passive film and deposits, and increase the ionization rate of the metal to increase the current density.

The metal brightness and smoothness in different electrolytes can be directly observed from polarization tests, providing information as to the effect of electrolytes on the etching process. In region AB of the polarization curve metal is eroded. The metal surface roughness is high due to the different dissolution rates of the various microscopic areas on the surface. At high anode voltages (region BC), the metal surface becomes smoothed or even polished, as in the case of curve 1. If the anode voltage reaches the CD region, the metal dissolution at higher voltages will lead to a polished surface with macrodefects (such as fine lines, striations and pits). The optimal polarization curve should (1) indicate a low breakdown voltage ($E_{ab}$), (2) have a high ratio of $\Delta I/\Delta E$, and (3) provide a smooth and shiny surface.

DC polarization studies were carried out in order to select an electrolyte that would enable the pulse/pulse reverse process for electropolishing Nb coupons. The 2-electrode DC polarization studies were performed on 25.4 mm×25.4 mm×3 mm Nb coupons to study the electrochemical activity (e.g. total current density) of Nb in different electrolyte type and concentrations. A platinum coated Nb mesh was used as the cathode. All polarization curve experiments were performed at room temperature (~20° C.). A TecNu power supply was used for this study (Model SPR-300/100/48-3). The cell voltage was raised by increments of five volts per minute. Total current densities were read from the oscilloscope trace recorded on a FLUKE 196C Scopemeter color system.

Figure 7:
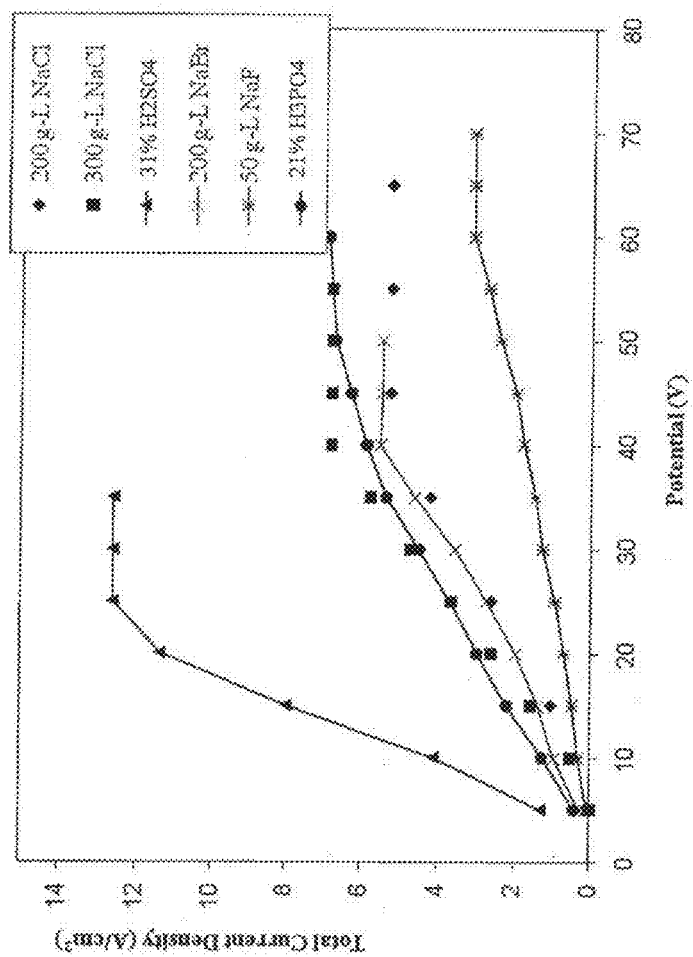
FIG. 7 is a two electrode polarization curve for Niobium in different electrolytes.

FIG. 7 summarizes the electrochemical activity of Nb substrates in different electrolytes, 200 and 300 g/L sodium chloride (NaCl), 31% by weight sulfuric acid ($H_2SO_4$), 200 g/L sodium bromide (NaBr), 50 g/L sodium fluoride (NaF) and 21% by weight phosphoric acid ($H_3PO_4$). In all cases breakdown of the Nb was not observed; any current measured is assumed to be associated with water oxidation ($2H_2O \rightarrow O_2 + 2H^+ + 2e^-$) and Nb anodization. The highest and lowest total current density observed for voltages up to 70 V was in the 31% by weight $H_2SO_4$ and 50 g/L NaF electrolytes, respectively.

This data demonstrated the tenacity of the Nb oxide film; DC polarization studies were unable to shed any light on the conditions that would be required to break down the oxide film without the use of hydrofluoric acid. Electrochemical cells with variable flow as shown in FIG. 4 were used to test the efficacy of pulse/pulse reverse waveforms in electropolishing Nb. As described in the prior art, variable flow channel cells are used to successfully perform metal removal of passive metal and alloys.[1, 2] An advantage of electrolyte flow is the removal of undesired byproducts from the surface of the substrate being electropolished, such as Nb ions, heat and bubbles (resulting mainly due to oxygen and hydrogen generation from water electrolysis).

[1] A. Lozano-Morales, A. Bonifas, M. Inman, P. Miller and E. J. Taylor, *J. Appl. Surf. Finish.*, 2 (3), 192-197 (2007).
[2] J. J. Sun, E. J. Taylor, R. Srinivasan, *J. Materials Processing Technology*, 108 356-368 (2001).

As reported in the prior art, a 300 g/L NaCl electrolyte has been successfully used for pulse/pulse reverse electropolishing different passive materials such as nickel based alloys and stainless steel, and therefore it was used to initially study the electrochemical activity of Nb. An initial design of experiments set was developed using statistical software called MINITAB®. Frequency, duty cycle and reverse (cathodic) voltage were varied with three levels for each variable. Three different frequencies were varied at 10, 100 and 1000 Hz at three different forward (anodic) duty cycles ($D_f$=10, 50 and 90%), and three different reverse voltages ($V_r$=2, 4 and 8 V). A Nb coupon of the same dimension as the anode was used as the cathode. The electrolyte velocity was kept constant at 12 m/s and a forward (anodic) voltage ($V_f$) of 48 V was used in all the experiments at ambient temperature (~20° C.). The temperature of the electrolyte was not controlled. The total run time in each case was 10 minutes.

While uniform etching was not achieved in 300 g/l NaCl, there was evidence of Nb breakdown at the coupon edges, where the electrolyte flow entered and exited the cell. Oxides were also formed on the surface, indicating electrochemical activity. These oxides were not tenacious, able to be removed using a scotch-brite pad, soap and water. However, high electrolyte flows and very close electrode gaps are not likely to be realistically accommodated.

In initial experiments in 31% by weight $H_2SO_4$, the constant parameters were electrolyte velocity ($E_v$)=0.4 m/s, $V_f$=20 V, $V_r$=8 V, run time=10 minutes, anode to cathode distance=5 mm, and ambient temperature (~20° C.). Since the low flow channel cell did not have temperature control built in, the electrolyte temperature rose from an initial value of 20° C. to around 27° C. by the end of every experiment. In conventional electropolishing, temperatures above 40° C. must be avoided in order to prevent etching pits on the Nb substrate.[3] A design of experiments set was performed using MINITAB®. Two different frequencies were used (10 and 1000 Hz) at two different duty cycles ($D_f$=10 and 90%), (see Table 1), for a total number of 3 experiments.

[3] L. Lilje, E. Kako, D. Kostin, A. Matheisen, W.-D Moller, D. Proch, D. Reschke, K. Saito, P. Schmuser, S. Simrock, T. Suzuki, and K. Twarowski, Nuclear Instruments and Methods in Physics Research A 524 1-12 (2004).

TABLE 1

Design of experiments using reverse pulse waveforms to electropolish Nb in a 31% by weight $H_2SO_4$ electrolyte for 10 minutes using a $V_f$ = 20 V and anode-cathode distance of 5 mm.

| Run Order | Frequency (Hz) | Forward (Anodic) Duty Cycle (%) | Reverse Voltage ($V_r$) |
|---|---|---|---|
| 1 | 10 | 90 | 8 |
| 2 | 1000 | 10 | 8 |
| 3 | 1000 | 90 | 8 |

Run 1 showed no evidence of etching at all. The different colors observed represent Nb oxide layers formed on the substrate. Run 2 showed some degree of etching, which suggested that Nb substrates could be uniformly electrochemically etched in an electrolyte free of hydrofluoric acid. Run 3 also showed some degree of etching, but much lower compared to Run 2.

Based on these preliminary results, the pulse/pulse reverse waveform used for Run 2 was further explored. Specifically, the same waveform parameters as Run 2 were used, but the coupon was electropolished for 37 minutes instead of 10 minutes. 100 µm of Nb was successfully removed uniformly from the coupon at an average removal rate of 2.7 µm/min in an area approximately 161 mm².

Figure 8:
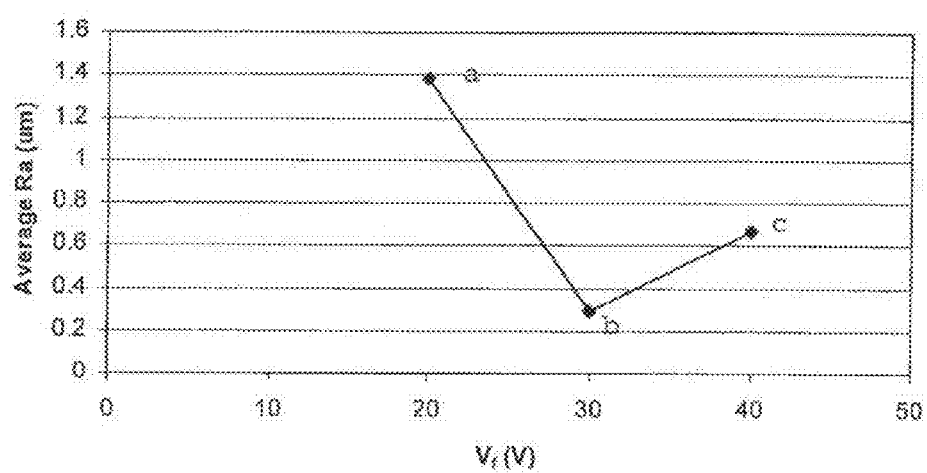
FIG. 8 is a graph showing the effect of Vf on the average surface roughness of Nb after electropolishing in 31% by weight $H_2SO_4$ electrolytes at ambient temperature (~20° C.) using (a) Vf=20 V; (b) Vf=30 V; and (c) Vf=40 V.

The effect of raising $V_f$ from 20 to 30 to 40 V on Nb electropolishing performance was studied. In all cases, the other pulse/pulse reverse process parameters were kept constant: $V_r$=8 V, frequency=1000 Hz, $D_f/D_r$=10%/90%. FIG. 8 summarizes the effect of anodic peak voltage on Nb surface finish. The roughest surface finish was obtained at 20 V. When $V_f$ was increased to 30 V, the surface finish of Nb dropped from 1.38 µm to 0.29 µm. At 40 V the Nb surface finish started getting rougher again and surface discoloration was observed.

Figure 9:
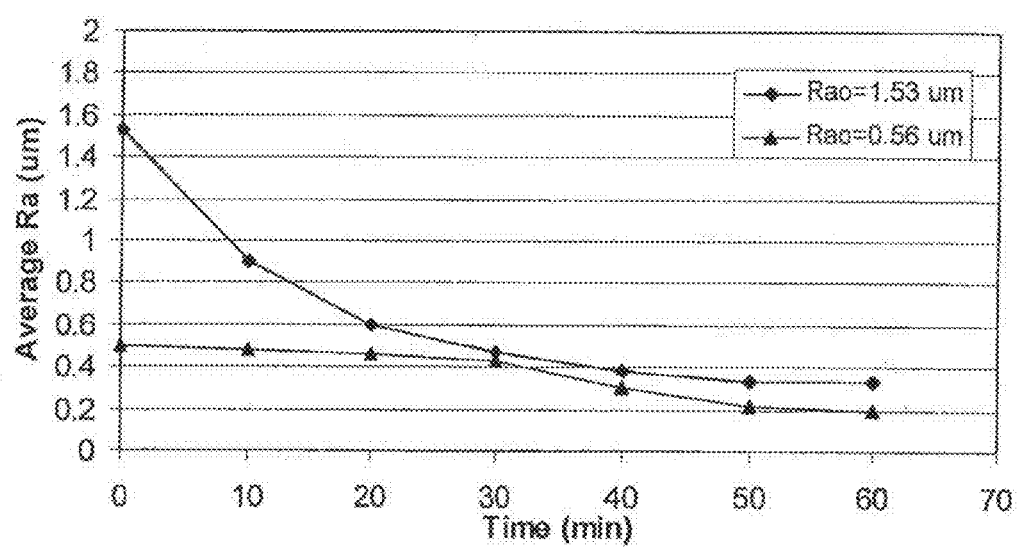
FIG. 9 is a graph showing the effect of time on the average surface roughness of Nb after electropolishing in 31% by weight $H_2SO_4$ electrolytes at room temperature (~20° C.) using Vf=30 V, Vr=8 V, frequency=1000 Hz, Df/Dr=10%/90% and different Rao.

The effect of Nb initial surface roughness, $Ra_o$ on final surface roughness, $Ra_f$ was also studied by performing electropolishing time studies at different $Ra_o$. FIG. 9 compares the effect of time on the average surface roughness of a Nb coupon after electropolishing in a 31% by weight $H_2SO_4$ electrolyte for $Ra_o$=0.56 µm (Run #4) and $Ra_o$=1.53 µm (Run #5). For the higher initial surface roughness, there was a significant decrease in Ra after 10 minutes, from 1.53 µm to ~0.85 µm. Thereafter, Ra decreased further by increasing electropolishing time up to 60 minutes down to an $Ra_f$ of 0.33 µm. Further decreases in surface finish did not occur after 50 minutes.

Accordingly, electrochemical machining systems and methods employing the disclosed electrolyte solution with the disclosed anodic pulse-cathodic pulse waveform may be used to process niobium and niobium alloys, as well as other metals and metal alloys, without the need for fluoride acids or salts, such hydrofluoric acid.

Although various aspects of the disclosed electrochemical system and method for machining niobium and other metals have been shown and described, modifications may occur to those skilled in the art upon reading the specification. The present application includes such modifications and is limited only by the scope of the claims.

What is claimed is:

1. A method for electrochemically machining a hollow body of a metal or metal alloy, the method comprising:
   positioning an electrode within a hollow body comprising a metal or metal alloy, wherein the hollow body has a variable internal diameter;
   orienting the hollow body vertically, with the electrode oriented vertically therein;
   at least partially filling the hollow body with an aqueous, acidic electrolyte solution, the electrolyte solution being devoid of hydrofluoric acid and having a viscosity less than 15 cP; and
   passing an electric current between the hollow body and the electrode, wherein the electric current is comprised of a plurality of anodic pulses and a plurality of cathodic pulses, and wherein the cathodic pulses are interposed between at least some of the anodic pulses, and
   wherein the hollow body and electrode do not rotate during the passing as electric current step.

2. The method of claim 1, wherein the electrolyte solution has a viscosity less than about 4 cP.

3. The method of claim 2, wherein the electrolyte solution has a conductivity greater than about 200 mS/cm.

4. The method of claim 3, wherein the voltage and on time of the anodic pulses are adjusted to polish the hollow body while limiting the formation of passivating metal oxide to a thickness that can be removed effectively by the cathodic pulse.

5. The method of claim 4, wherein the cathodic pulse voltage is greater than 4 V.

6. The method of claim 1, wherein the metal or metal alloy forms a strongly-bonded passivation layer during the anodic pulses of the passing an electric current step.

7. The method of claim 6, wherein the metal or metal alloy of the hollow body is selected from the group consisting of niobium and niobium alloys, titanium and titanium alloys, zirconium and zirconium alloys, hafnium and hafnium alloys, tantalum and tantalum alloys, molybdenum and molybdenum alloys, tungsten and tungsten alloys, and chromium cobalt alloys.

8. The method of claim 7, wherein said hollow body comprises niobium or niobium alloy.

9. The method of claim 1, wherein the electrolyte contains at least about 10% water.

10. The method of claim 9, wherein the electrolyte contains about 1% by weight to 70% by weight sulfuric acid.

11. The method of claim 10, wherein the electrolyte contains about 20% by weight to 40% by weight sulfuric acid.

12. The method of claim 1, with the provision that the said electrolyte solution is substantially free of fluorine acids and salts.

13. The method of claim 1, further comprising entirely filling the hollow body with the electrolyte solution.

14. The method of claim 1, wherein the hollow body has a bottom and a top and wherein the step of filling further comprises filling said hollow body through the bottom thereof and expelling the electrolyte solution through the top thereof, wherein the electrolyte solution flows through the hollow body during the passing an electric current step.

15. The method of claim 1, wherein the hollow body comprises a bulbous portion.

16. The method of claim 1, wherein the hollow body includes a first end portion, a second end portion, and a central portion, wherein a maximum internal diameter of said hollow body is disposed on the central portion thereof.

17. The method of claim 1, wherein the electrode is linear.

18. A method for electrochemically machining a hollow niobium body, the method comprising:
   positioning an electrode within a hollow body, wherein the hollow body has a variable internal diameter and comprises niobium or niobium alloy;
   orienting the hollow body vertically, with the electrode oriented vertically therein;
   at least partially filling the hollow body with an electrolyte solution comprising aqueous sulfuric acid and being devoid of hydrofluoric acid and having a viscosity less than 15 cP; and
   passing an electric current between the hollow body and the electrode, wherein the electric current is comprised of a plurality of anodic pulses and a plurality of cathodic pulses, and wherein the cathodic pulses are interposed between at least some of the anodic pulses, and
   wherein the hollow body and electrode do not rotate during the passing an electric current step.

19. The method of claim 18, wherein the electrode is linear.

* * * * *